United States Patent
Kari et al.

(10) Patent No.: US 7,614,564 B2
(45) Date of Patent: Nov. 10, 2009

(54) CLOCK GENERATION METHOD AND DEVICE FOR DECODING FROM AN ASYNCHRONOUS DATA SIGNAL

(75) Inventors: Ahmed Kari, Aix en Provence (FR); David Naura, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 543 days.

(21) Appl. No.: 11/267,949

(22) Filed: Nov. 4, 2005

(65) Prior Publication Data
US 2006/0115003 A1    Jun. 1, 2006

(30) Foreign Application Priority Data
Nov. 4, 2004    (FR)    ............................ 04 11754

(51) Int. Cl.
*G06K 19/06* (2006.01)
(52) U.S. Cl. ............................................ 235/492
(58) Field of Classification Search .............. 235/377, 235/439, 451, 492, 494; 345/179
See application file for complete search history.

(56) References Cited

U.S. PATENT DOCUMENTS 3,868,626 A * 2/1975 Masher ..................... 340/939
6,529,189 B1 * 3/2003 Colgan et al. ............. 345/179

FOREIGN PATENT DOCUMENTS
EP         0 967 562         12/1999

* cited by examiner

*Primary Examiner*—Kumiko C Koyama
(74) *Attorney, Agent, or Firm*—Lisa K. Jorgenson; Stephen Bongini; Fleit Gibbons Gutman Bongini & Bianco P.L.

(57) ABSTRACT

A method is provided for decoding an encoded binary data signal and generating a clock signal that is synchronous with the encoded data signal. There is generated, from the encoded data signal, an edge detection signal comprising four pulses per binary state of the encoded data signal. The encoded data signal is sampled every four pulses of the edge detection signal so as to obtain a binary signal of decoded data, and from the edge detection signal there is generated a binary clock signal that is synchronous with the encoded data signal and changes logic state every two pulses of the edge detection signal.

19 Claims, 5 Drawing Sheets

CLOCK GENERATION METHOD AND DEVICE FOR DECODING FROM AN ASYNCHRONOUS DATA SIGNAL

CROSS-REFERENCE TO RELATED APPLICATIONS

This application is based upon and claims priority from prior French Patent Application No. 04 11754, filed Nov. 4, 2004, the entire disclosure of which is herein incorporated by reference.

FIELD OF THE INVENTION

The present invention relates to RFID (Radio Frequency IDentification) systems, and in particular to the decoding of data from an electronic label or a contactless smart card for contactless reading.

BACKGROUND OF THE INVENTION

FIG. 1 shows a device for transmitting data to and receiving data from a smart card 1. When being transmitted to the smart card, the data to be transmitted is applied to a modulator 4 that receives a carrier. According to the EPC Global standard, this carrier is located in the UHF band between 868 MHz and 925 MHz. The output signal of the modulator is supplied to a transmitting/receiving antenna 2 by a coupler 3. When being received, the data transmitted by the smart card 1 is received by the antenna 2 and applied by the coupler 3 to a circuit 5 for IQ demodulation, filtering and amplification that makes it possible to extract, from the signal received, the envelope of the carrier constituting the encoded data. This encoded data is applied to a decoding device 6 that delivers decoded data.

FIG. 2 shows the principle of encoding data in accordance with the EPC Class1-gen1 protocol. In this figure, a binary "0" is transmitted in the form of a square wave period with a period t0, while a binary "1" is transmitted in the form of two square wave periods with a period t0/2 in phase with the signal corresponding to the binary "0". FIG. 8 shows the form of an encoded data CD signal according to the principle shown in FIG. 2. The example of FIG. 8 shows the signal for encoding the binary data "00110000".

In general, the decoding of the encoded data signal that is received, which is performed by the decoding device 6, involves a microcontroller which must be controlled by a clock signal CLK that is synchronous with the encoded data signal received.

SUMMARY OF THE INVENTION

It is an object of the present invention to provide a simplified device for decoding and generating a clock signal that is synchronous with the data signal.

One embodiment of the present invention provides a method for decoding an encoded binary data signal and generating a clock signal that is synchronous with the encoded data signal. Each binary data item of the encoded data signal has a predefined duration and, according to its binary state, one period or two periods of a periodic square wave. According to the method, from the encoded data signal there is generated an edge detection signal comprising four pulses per binary state of the encoded data signal. The encoded data signal is sampled every four pulses of the edge detection signal so as to obtain a binary signal of decoded data, and from the edge detection signal there is generated a binary clock signal that is synchronous with the encoded data signal. The binary clock signal changes logic state every two pulses of the edge detection signal.

Another embodiment of the present invention provides a decoder for decoding an encoded binary data signal and generating a clock signal that is synchronous with the encoded data signal. Each binary data item of the encoded data signal has a predefined duration and, according to its binary state, one period or two periods of a periodic square wave. The decoder includes a first circuit for detecting edges in the encoded data signal and a second circuit for sampling the encoded data signal. The first circuit generates an edge detection signal comprising four pulses per binary state of the encoded data signal, and the second circuit samples the encoded data signal every four pulses of the edge detection signal so as to obtain a binary signal of decoded data. The second circuit generates, from the edge detection signal, a binary clock signal that is synchronous with the encoded data signal. The binary clock signal changes logic state every two pulses of the edge detection signal.

Yet another embodiment of the present invention provides a device for transmitting data to and receiving data from a smart card that includes such a decoder.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
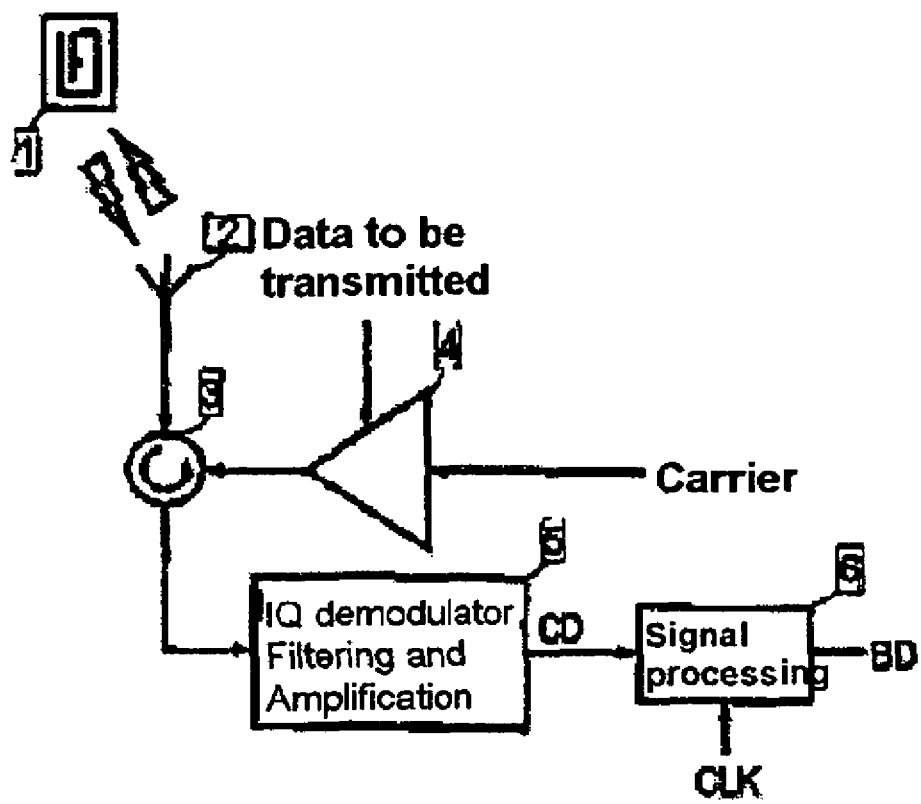
FIG. 1 shows a device for transmitting data to and receiving data from an RFID smart card.

Preferred embodiments of the present invention will be described in detail hereinbelow with reference to the attached drawings.

One embodiment of the present invention provides a method for decoding an encoded binary data signal and for generating a clock signal synchronous with the encoded data signal. Each binary data item of the encoded data signal has a predefined duration and, according to its binary state, the form of a period or two periods of a periodic square wave. According to the method, from the encoded data signal there is generated a signal for detecting edges comprising four pulses per binary state of the encoded data signal. The encoded data signal is sampled every four pulses of the edge detection signal so as to obtain a decoded data binary signal, and from the edge detection signal there is generated a binary clock signal synchronous with the encoded data signal, and having a change in logic state every two pulses of the edge detection signal.

In a preferred embodiment of the present invention, the edge detection signal is generated from a signal for detecting rising and falling edges in the encoded data signal, and two signals for detecting a rising and falling edge in data encoded at 0 in the encoded data signal.

Preferably, the signals for detecting falling and rising edges in the data encoded at 0 are obtained by charging and discharging capacitors according to the encoded data signal and according to the encoded data signal that was previously inverted, by comparing the signals obtained to a threshold voltage, and by detecting rising edges in the comparison signal.

In some embodiments of the present invention, the number of pulses in the edge detection signal are counted using a 2-bit counter which is set to 0 at the beginning of a first binary data item of the encoded data signal. The encoded data signal is sampled when the counter reaches 3, the clock signal generated switches to high level when the counter is at 1, and switches to low level when the counter is at 3.

Another embodiment of the present invention provides a device for decoding an encoded binary data signal, and for generating a clock signal synchronous with the encoded data signal. Each binary data item of the encoded data signal has a predefined duration, and, according to its binary state, the form of one period or two periods of a periodic square wave. The device includes a first circuit for detecting edges in the encoded data signal and generating an edge detection signal comprising four pulses per binary state of the encoded data signal, and a second circuit for sampling the encoded data signal. The second circuit samples the encoded data signal every four pulses of the edge detection signal so as to obtain a binary signal of decoded data, and generates, from the edge detection signal, a binary clock signal synchronous with the encoded data signal and having a change in logic state every two pulses of the edge detection signal.

In a preferred embodiment of the present invention, the edge detection circuit includes a circuit for detecting rising and falling edges in the encoded data signal and producing a first edge detection signal, a circuit for detecting rising edges in data encoded at 0 in the encoded data signal and producing a second edge detection signal, and a circuit for detecting falling edges in data encoded at 0 in the encoded data signal and producing a third edge detection signal.

Preferably, each of the circuits for detecting rising and falling edges in the data encoded at 0 in the encoded data signal includes a capacitor associated with a circuit for charging and discharging the capacitor according to the encoded data signal, a comparator for comparing the charging and discharging signal to a threshold voltage, and a circuit for detecting a rising edge in the comparison signal and delivering the signal for detecting falling edges and the signal for detecting rising edges.

In one embodiment of the present invention, the capacitor charge and discharge circuit of each circuit for detecting falling and rising edges in the data encoded at 0 in the encoded data signal includes a set of transistors connected in series between a constant power source and ground, and controlled according to the encoded data signal.

In some embodiments of the present invention, the comparator of each circuit for detecting falling and rising edges in the data encoded at 0 in the encoded data signal includes inverters connected in series with the conduction thresholds selected so as to correspond to the threshold voltage.

Exemplary embodiments of the present invention will now be described in detail with reference to FIGS. 3-9.

In the method according to the preferred embodiment of the present invention, first there is generated, from the encoded data CD signal, an FD signal comprising four pulses per data item of the encoded data CD signal, and then the pulses are counted in order to sample the encoded data CD signal every four pulses so as to obtain a binary signal BD of decoded data. There is generated a clock CLK signal synchronous with the CD signal and changing states every two pulses.

Figure 3:
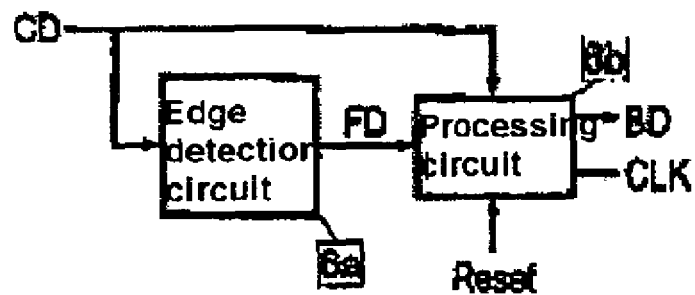
FIG. 3 shows a device for decoding and generating a synchronous clock signal according to a preferred embodiment of the present invention.

FIG. 3 shows a device for decoding and generating a synchronous clock signal according to a preferred embodiment the present invention. As shown, the device includes a first circuit 6a for detecting edges, and a processing circuit 6b. The first circuit 6a receives the encoded data CD signal and delivers the FD signal. The processing circuit 6b receives the encoded data CD signal, the FD signal, and a reset signal, and delivers a BD signal of the decoded binary data contained in the CD input signal, and a clock CLK signal synchronous with the encoded data CD signal that is received at the input.

Figure 4:
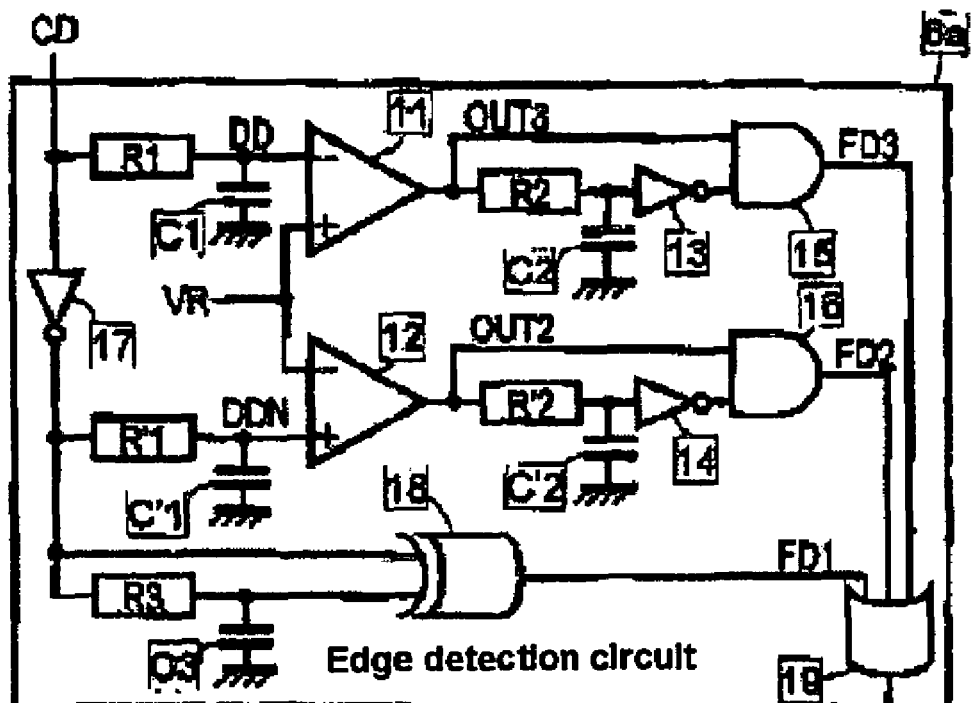
FIG. 4 shows one embodiment of a first circuit for detecting edges in the device of FIG. 3.

FIG. 4 shows one embodiment of the first circuit 6a for detecting edges. The first circuit 6a includes a resistor R1 that receives the encoded data CD signal. The resistor R1 is connected to a capacitor C1 that is also connected to the ground. The signal DD passing through the point of contact between the resistor R1 and the capacitor C1 is supplied to the inverting input of a first comparator 11 whose non-inverting input receives a reference voltage VR. The output signal OUT3 of the first comparator is supplied to an input of a first AND gate 15 and passes through a resistor R2 whose other terminal is connected to ground by a capacitor C2 and is also connected to an inverter 13. The output of the inverter 13 is connected to the other input of the first AND gate 15, which delivers a first edge detection signal FD3.

The encoded data CD signal is also applied to an inverter 17 whose output is connected to a resistor R'1 that is connected to a capacitor C'1 that is also connected to ground. The DDN signal passing through the point of contact between the resistor R'1 and the capacitor C'1 is supplied to the non-inverting input of a second comparator 12 whose inverting input receives the reference voltage VR. The output signal OUT2 of the second comparator 12 is supplied to an input of a second AND gate 16 and passes through a resistor R'2 whose other terminal is connected to ground by a capacitor C'2 and is also connected to an inverter 14. The output of the inverter 14 is connected to the other input of the second AND gate 16, which delivers a second edge detection signal FD2.

The output of the inverter 17 is also connected to the input of an EXCLUSIVE-OR gate 18, as well as to a resistor R3 whose other terminal is connected to the other input of the EXCLUSIVE-OR gate 18 and to ground by a capacitor C3. The EXCLUSIVE-OR gate 18 delivers a third signal FD1 for detecting the two (for a binary "0") or four (for a binary "1") rising edges of each encoded data item.

The signal FD1 is supplied with the signals FD2 and FD3 to the input of an OR gate 19 that delivers an edge detection FD signal comprising 4 pulses for each encoded data item.

Figure 2:
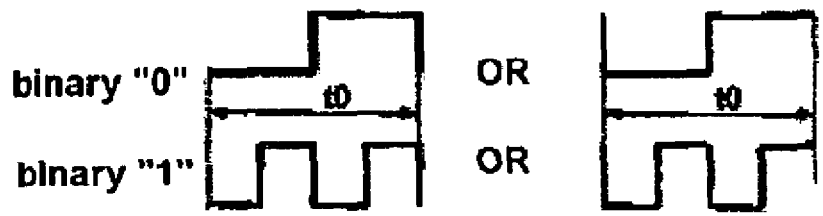
FIG. 2 shows the principle of encoding data in accordance with the EPC Class1-gen1 protocol.
Figure 8:
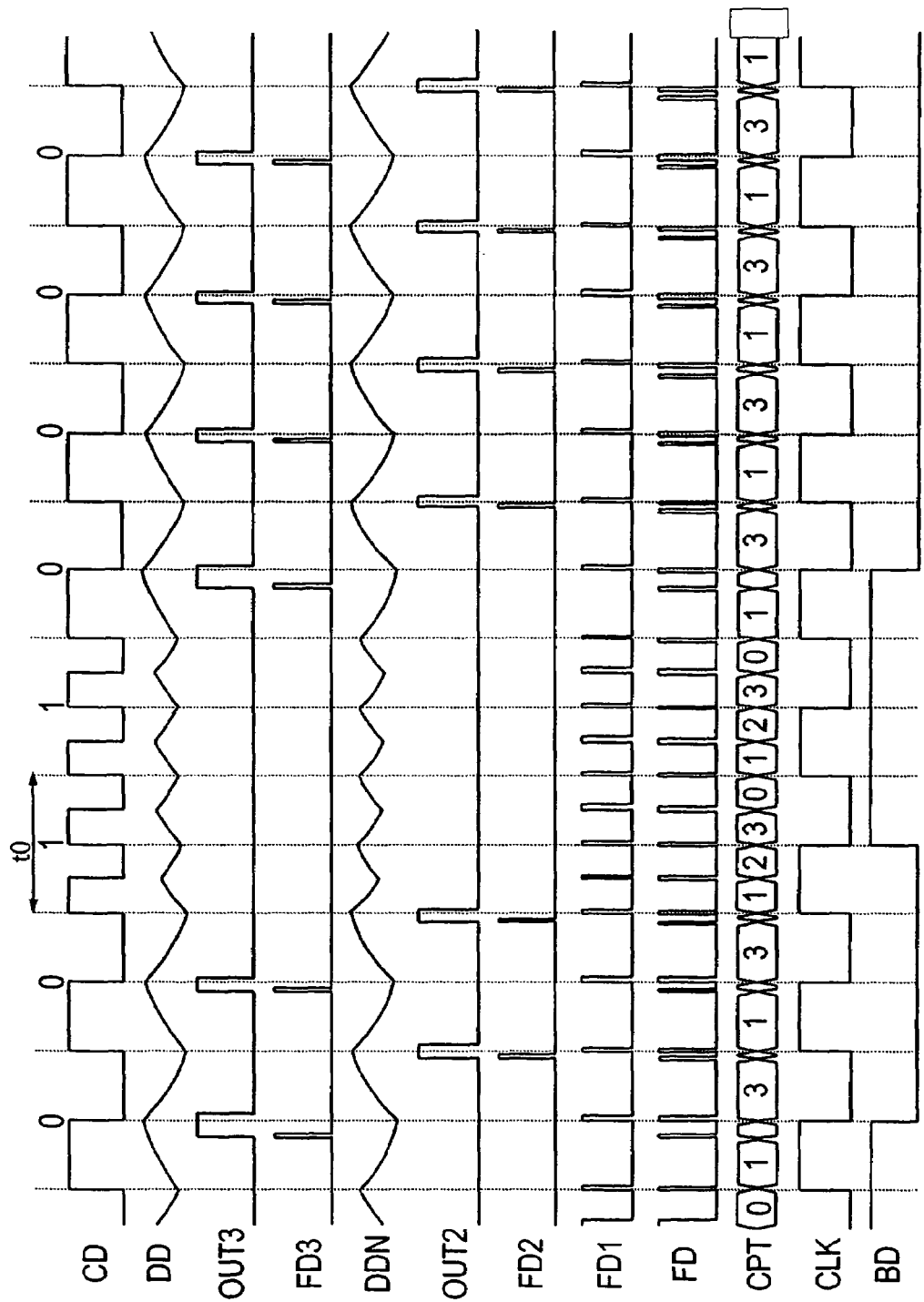
FIG. 8 shows a timing chart of different signals in the device of FIGS. 3, 4, and 6.

The values of the resistors R1 and R'1 and the values of the capacitors C1 and C'1 are selected so that the time constant $R1 \cdot C1 = R'1 \cdot C'1$ is equal to $t0/4$, with $t0$ being the period of a data element in the encoded data signal, as shown in FIGS. 2 and 8. For example, if $t0=8$ µs (as in the case of the European EPC standard), $R1=R'1=200$ kΩ and $C1=C'1=10$ pF.

Figure 5:
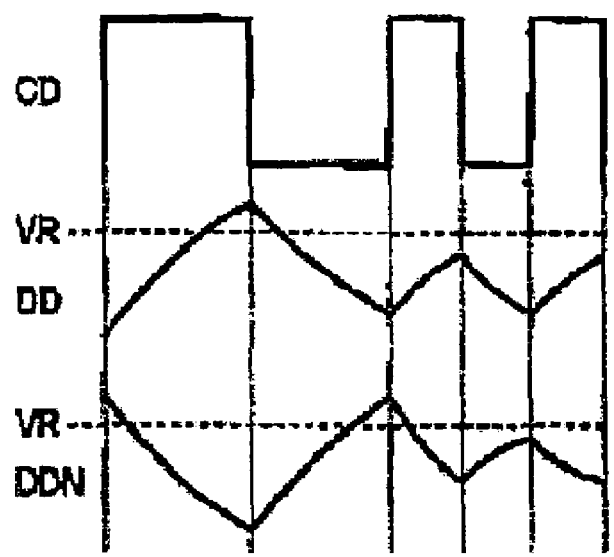
FIG. 5 shows some signals in the first circuit of FIG. 4.

The reference voltage VR is selected so as to generate, at the output of the two comparators 11 and 12 (as shown in FIGS. 5 and 8): no pulse if the encoded data item corresponds to a binary "1", a pulse per encoded data item corresponding to a binary "0" for the comparator 11, and a pulse per encoded data item corresponding to a binary "0" for the comparator 12.

FIG. 8 shows a timing chart of the signals CD, DD, OUT3, FD3, DDN, OUT2, FD2, FD1, and FD. As shown, the signal FD3 presents a pulse for each falling edge of data equal to 0 in the encoded data CD signal. The signal FD2 presents a pulse for each rising edge of data equal to 0 in the encoded data CD signal. The signal FD1 presents a pulse for each rising and falling edge in the encoded data CD signal. The signal FD, which corresponds to the sum of the signals FD1, FD2, and FD3, comprises four pulses for each encoded data item. Namely, for the data items equal to 0, one pulse is provided by each of the signals FD2 and FD3 and two pulses are provided by the signal FD1. The four pulses for the data items equal to 1 are provided by the signal FD1.

Figure 6:
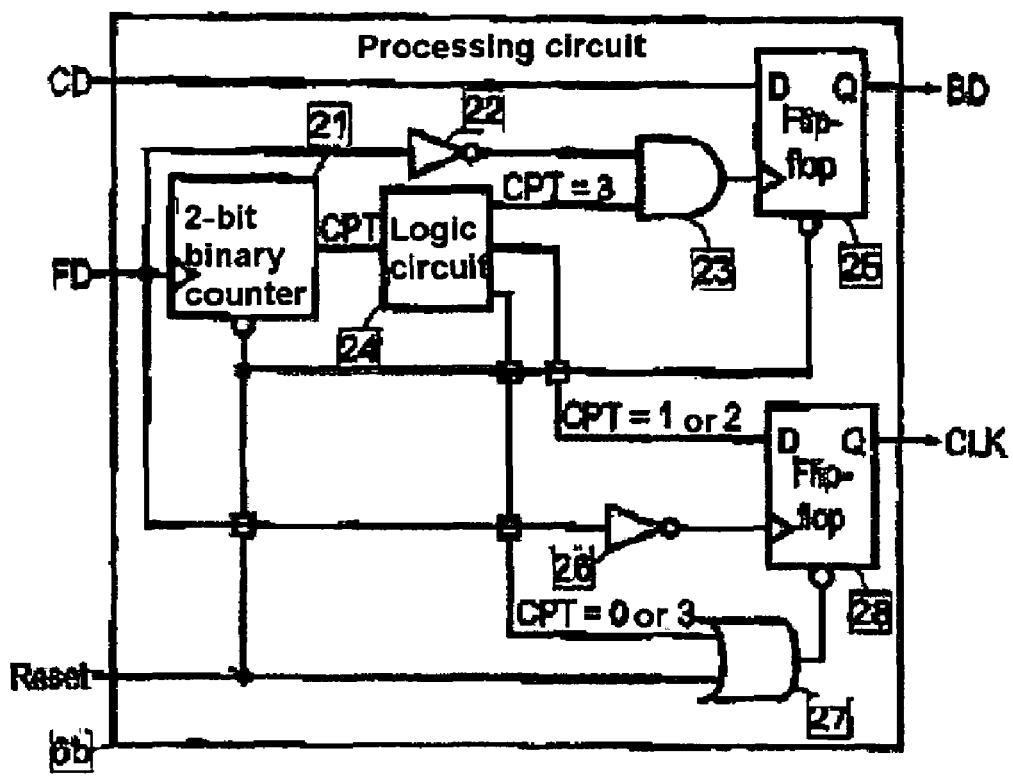
FIG. 6 shows one embodiment of a processing circuit in the device of FIG. 3.

FIG. 6 shows one embodiment of the processing circuit. The processing circuit 6b includes a two-bit binary counter 21 that receives the FD signal and supplies its output to a logic circuit 24 having three outputs whose values are dependent on the value of the counter 21. A first output of the logic circuit, which delivers a first logic signal at 1 if the value of the counter is equal to 3, is connected to an AND gate 23 that receives, at its other input, the signal FD inverted by an inverter 22. The output of the AND gate 23 is connected to the clock signal input of a first D flip-flop 25 that receives, at its input D, the encoded data CD signal and delivers, on its output Q, the binary data BD signal of the decoded data.

A second output of the logic circuit 24, which delivers a second logic signal at 1 if the value of the counter is equal to 1 or 2, is connected to the input D of a second D flip-flop 28 that receives, at its clock signal input, the signal FD inverted by an inverter 26 and delivers, at its output Q, the clock CLK signal that is synchronous with the encoded data CD signal.

The reset inputs of the binary counter 21 and the first D flip-flop 25 are connected to a reset signal input of the processing circuit 6.

A third output of the logic circuit 24, which delivers a third logic signal at 1 if the value of the counter is equal to 0 or 3, is connected to an input of an OR gate 27 whose other input is connected to the reset signal that is input to the circuit. The output of the OR gate 27 is connected to the reset input of the second D flip-flop 28.

The principle of operation of the circuit of FIG. 6 is shown in FIG. 8. At the beginning of the scanning of the smart card 1, the circuit is reset by the reset signal to 0. The CPT value of the binary counter 21 is then at "000", while the output Q of the flip-flops is at 0. As soon as a CD signal is received from the smart card, the reset signal changes to 1 and the counter begins counting the pulses (rising edges) of the FD signal. When the CPT value of the counter reaches "011" (3), the signal coming from the smart card is sampled by the trigger 25 on a falling edge of the FD signal, which corresponds to the binary decoding of the encoded data CD signal.

When the CPT value of the counter reaches the value "001" (1) or "010" (2), the clock CLK signal changes to 1, and for all of the other values of the counter, this signal changes to 0. The clock CLK signal thus generated is a square wave of frequency 1/t0, synchronous with the edges (rising and falling edges of the data at 0 and rising edges of the data at 1) of the encoded data CD signal.

As the clock CLK signal is generated from the encoded data CD signal, it is clear that these two signals are always strictly in phase, even if the CD signal to be processed comprises slight phase or frequency variations. It is not possible to achieve such a result with a phase-locked loop.

Figure 7:
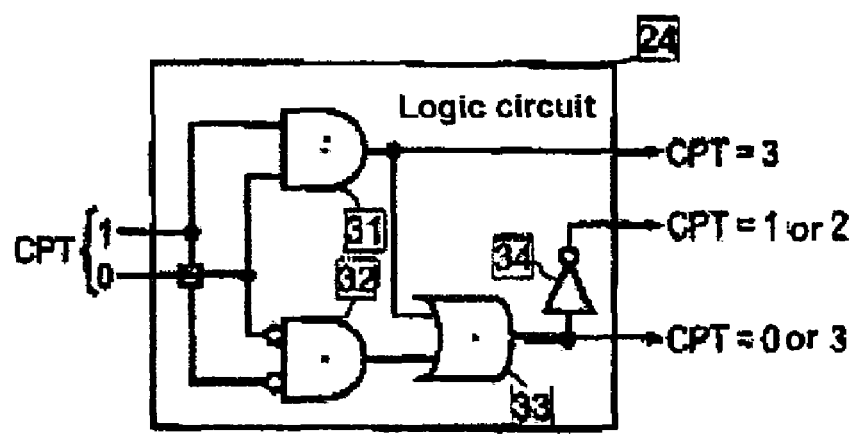
FIG. 7 shows an exemplary embodiment of the logic circuit of the processing circuit of FIG. 6.

FIG. 7 shows an exemplary embodiment of the logic circuit 24. As shown, this circuit receives, at its inputs, the 0 and 1 bits of the binary counter 21. The first logic signal (at 1 if the value of the counter is equal to 3) is obtained with an AND gate 31 that receives, at its inputs, the 0 and 1 bits of the binary counter 21.

The third logic signal (at 1 if the value of the counter is equal to 0 or 3) is obtained with the AND gate 31, a gate 32 with inverted inputs, and an OR gate 33 that delivers the desired signal. The AND gate 32 receives, at its inputs, the 0 and 1 bits of the binary counter. The outputs of the AND gates 31 and 32 are connected to the inputs of the OR gate 33.

The second logic signal (at 1 if the value of the counter is equal to 1 or 2) is obtained with an inverter 34 that inverts the signal at the output of the OR gate 33.

Figure 9:
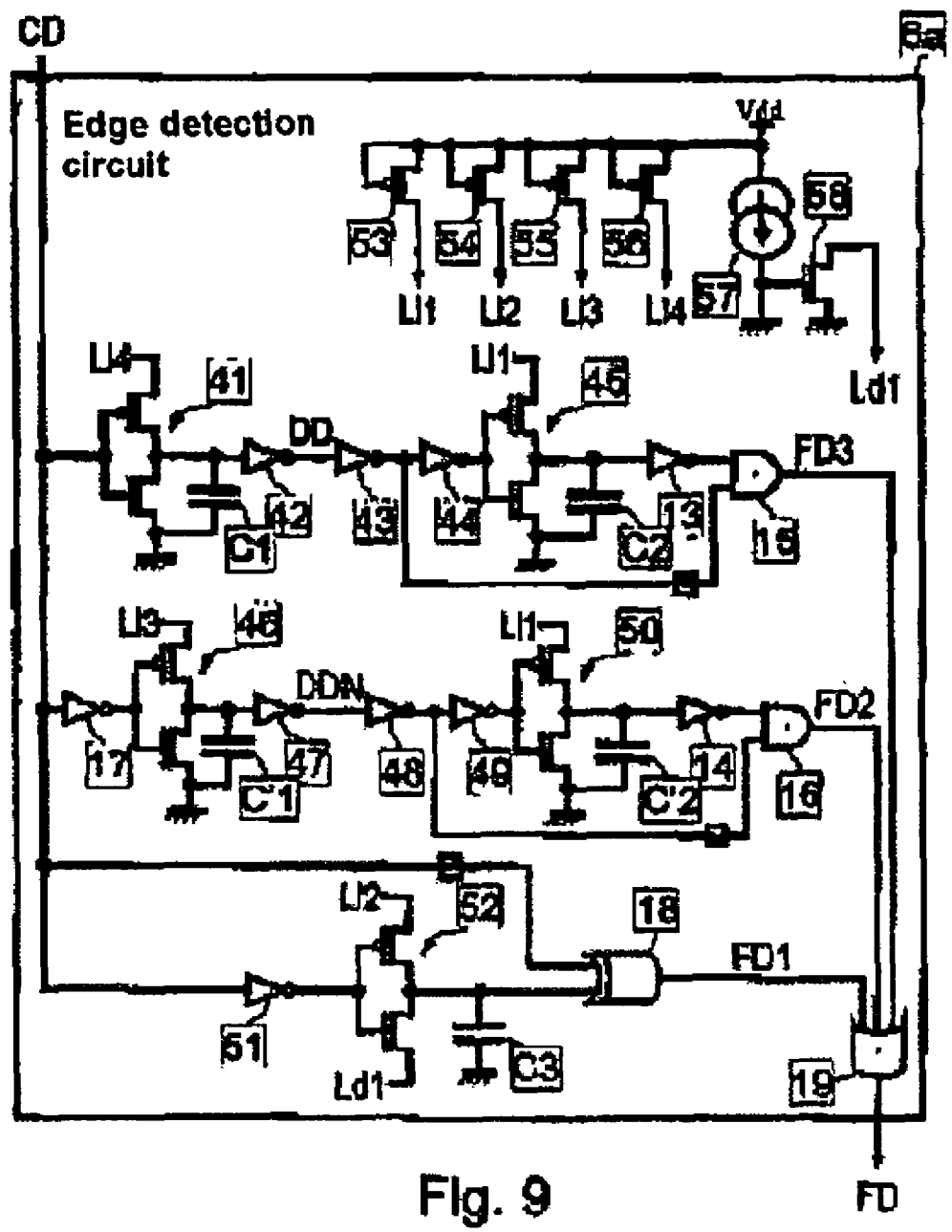
FIG. 9 shows another embodiment of the edge detection circuit.

FIG. 9 shows another embodiment of the edge detection circuit. In this embodiment, the resistors of the RC assemblies of the circuit of FIG. 4 have been replaced by an assembly of two MOS transistors connected to a power source, and each of the comparators 11 and 12 by an assembly of three inverters in series with the thresholds dependent on the size of the transistors with which they are formed.

Each MOS transistor assembly includes a PMOS transistor connected in series with an NMOS transistor, with the source of the PMOS transistor being connected to a power source, while the source of the NMOS transistor is connected to ground. The gates and drains of the two transistors are interconnected and respectively form the input of the assembly and the output of the assembly.

More specifically, the resistor R1 of the circuit shown in FIG. 4 is replaced in FIG. 9 with an assembly of transistors 41 of which the PMOS transistor source is connected to a power source L14. The comparator 11 is replaced by an assembly of three inverters 42, 43, and 44, with the output of the inverter 43 being connected to the input of the AND gate 15. The resistor R2 is replaced by an assembly of transistors 45 of which the PMOS transistor source is connected to a power source L11.

The resistor R'1 is replaced by an assembly of transistors 46 of which the PMOS transistor source is connected to a power source L13. The comparator 12 is replaced by an assembly of three inverters 47, 48, and 49, with the output of the inverter 48 being connected to the input of the AND gate 16. The resistor R'2 is replaced by an assembly of transistors 50 of which the PMOS transistor source is connected to the power source L11. The resistor R3 is replaced by an assembly of transistors 52 of which the PMOS transistor source is connected to a power source L12, and the NMOS transistor source is connected to a power source Ld1.

The input of the encoded data CD signal is connected to the gate of the two transistors of the assembly 52 by an inverter 51, and connected directly to the input of the Exclusive-OR gate 18. The currents L11, L12, L13, and L14 are generated by a voltage source Vdd and a power source 57 and respective PMOS transistors 53, 54, 55, and 56 mounted in parallel, with the source and gate of these transistors being connected at the point of contact between the voltage source and the power source 57, and the drain of these transistors providing the corresponding currents L11, L12, L13, and L14 dependent on the size of the respective transistors. The other terminal of the power source 57 is connected to ground and to the gate of an NMOS transistor 58 whose source is connected to ground and whose drain provides the Ld1 current.

The edge detection circuit 6a of FIG. 9 has the advantages of suppressing the resistors, whose values vary according to the temperature, and involving only components that can be easily integrated in an integrated circuit.

The present invention is useful in RFID (Radio Frequency IDentification) systems, and is particularly, but not exclusively, suited to data transmitted in accordance with the EPC (Electronic Product Code™) standard.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for decoding an encoded binary data signal and generating a clock signal that is synchronous with the encoded data signal, the method comprising the steps of:
    receiving the encoded data signal, each binary data item of the encoded data signal having the same duration, and each binary data item of the encoded data signal having one period of a periodic square wave when the binary data item is a first binary state or two periods of a periodic square wave when the binary data item is a second binary state;
    generating, from the encoded data signal, an edge detection signal consisting of four pulses per binary data item of the encoded data signal;
    sampling a level of the encoded data signal once every four pulses of the edge detection signal, and generating a binary signal of decoded data according to the level of the encoded data signal that is sampled; and
    generating, from the edge detection signal, a binary clock signal that is synchronous with the encoded data signal, the binary clock signal changing logic state every two pulses of the edge detection signal.

2. The method according to claim 1, wherein the step of generating the edge detection signal comprises:
    generating, from the encoded data signal, a first signal that indicates rising and falling edges in the encoded data signal;
    generating, from the encoded data signal, second and third signals that indicate rising and falling edges in data representing the first binary state in the encoded data signal; and
    generating the edge detection signal from the first, second, and third signals.

3. The method according to claim 2,
    wherein generating the second signal comprises charging and discharging a first capacitor according to the level of the encoded data signal so as to produce a first charging and discharging signal, comparing the first charging and discharging signal with a threshold voltage so as to produce a first comparison signal, and detecting rising edges in the first comparison signal, and
    generating the third signal comprises charging and discharging a second capacitor according to the level of the encoded data signal after it has been inverted so as to produce a second charging and discharging signal, comparing the second charging and discharging signal with the threshold voltage so as to produce a second comparison signal, and detecting rising edges in the second comparison signal.

4. The method according to claim 3, further comprising the step of:
    counting the number of pulses in the edge detection signal using a 2-bit counter that is set to 0 at the beginning of a first binary data item of the encoded data signal,
    wherein the sampling step comprises sampling the level of the encoded data signal each time that the counter reaches 3, and
    the step of generating the binary clock signal comprises switching the generated clock signal to high level when the counter is at 1 and switching the generated clock signal to low level when the counter is at 3.

5. The method according to claim 1, further comprising the step of:
    counting the number of pulses in the edge detection signal using a 2-bit counter that is set to 0 at the beginning of a first binary data item of the encoded data signal,
    wherein the sampling step comprises sampling the level of the encoded data signal each time that the counter reaches 3, and
    the step of generating the binary clock signal comprises switching the generated clock signal to high level when the counter is at 1 and switching the generated clock signal to low level when the counter is at 3.

6. The method according to claim 1, wherein the first binary state is a binary "0" and the second binary state is a binary "1".

7. The method according to claim 1, wherein the encoded data signal is encoded in accordance with the EPC Class1-gen1 protocol.

8. A device for decoding an encoded binary data signal and generating a clock signal that is synchronous with the encoded data signal, the device comprising:
    a first circuit detecting edges in the encoded data signal, the first circuit generating, from the encoded data signal, an edge detection signal consisting of four pulses per binary data item of the encoded data signal; and
    a second circuit sampling the encoded data signal, the second circuit sampling a level of the encoded data signal once every four pulses of the edge detection signal, and generating a binary signal of decoded data according to the level of the encoded data signal that is sampled,
    wherein the second circuit generates, from the edge detection signal, a binary clock signal that is synchronous with the encoded data signal, the binary clock signal changing logic state every two pulses of the edge detection signal,
    each binary data item of the encoded data signal has the same duration, and
    each binary data item of the encoded data signal has one period of a periodic square wave when the binary data item is a first binary state or two periods of a periodic square wave when the binary data item is a second binary state.

9. The device according to claim 8, wherein the first circuit includes:
    a first detection circuit detecting rising and falling edges in the encoded data signal, the first detection circuit producing a first edge detection signal that indicates the rising and falling edges in the encoded data signal;
    a second detection circuit detecting rising edges in data representing the first binary state in the encoded data signal, the second detection circuit producing a second edge detection signal that indicates the rising edges in data representing the first binary state in the encoded data signal; and a third detection circuit detecting falling edges in data representing the first binary state in the encoded data signal, the third detection circuit producing a third edge detection signal that indicates the falling edges in data representing the first binary state in the encoded data signal.

10. The device according to claim 9, wherein each of the second and third detection circuits includes:

a capacitor;

a charging and discharging circuit charging and discharging the capacitor according to the level of the encoded data signal so as to produce a charging and discharging signal;

a comparator comparing the charging and discharging signal to a threshold voltage so as to produce a comparison signal; and a rising edge detection circuit detecting a rising edge in the comparison signal, the rising edge detection circuit producing the second or third edge detection signal based on rising edges in the comparison signal.

11. The device according to claim 10, wherein the charging and discharging circuit includes transistors connected in series between a constant power source and ground, the transistors being controlled according to the encoded data signal.

12. The device according to claim 11, wherein the comparator includes a plurality of inverters connected in series, conduction thresholds of the inverters being selected so as to correspond to the threshold voltage.

13. The device according to claim 10, wherein the comparator includes a plurality of inverters connected in series, conduction thresholds of the inverters being selected so as to correspond to the threshold voltage.

14. A device for transmitting data to and receiving data from a smart card, the device comprising:

an antenna;

a modulator coupled to the antenna; and a decoding device coupled to the antenna, the decoding device decoding an encoded binary data signal and generating a clock signal that is synchronous with the encoded data signal, each binary data item of the encoded data signal having the same duration, and each binary data item of the encoded data signal having one period of a periodic square wave when the binary data item is a first binary state or two periods of a periodic square wave when the binary data item is a second binary state, wherein the decoding device includes:

a first circuit detecting edges in the encoded data signal, the first circuit generating, from the encoded data signal, an edge detection signal consisting of four pulses per binary data item of the encoded data signal; and a second circuit sampling the encoded data signal, the second circuit sampling a level of the encoded data signal once every four pulses of the edge detection signal, generating a binary signal of decoded data according to the level of the encoded data signal that is sampled, and generating, from the edge detection signal, a binary clock signal that is synchronous with the encoded data signal, the binary clock signal changing logic state every two pulses of the edge detection signal.

15. The device according to claim 14, wherein the first circuit of the decoding device includes:

a first detection circuit detecting rising and falling edges in the encoded data signal, the first detection circuit producing a first edge detection signal that indicates the rising and falling edges in the encoded data signal;

a second detection circuit detecting rising edges in data representing the first binary state in the encoded data signal, the second detection circuit producing a second edge detection signal that indicates the rising edges in data representing the first binary state in the encoded data signal; and a third detection circuit detecting falling edges in data representing the first binary state in the encoded data signal, the third detection circuit producing a third edge detection signal that indicates the falling edges in data representing the first binary state in the encoded data signal.

16. The device according to claim 15, wherein each of the second and third detection circuits of the first circuit of the decoding device includes:

a capacitor;

a charging and discharging circuit charging and discharging the capacitor according to the level of the encoded data signal so as to produce a charging and discharging signal;

a comparator comparing the charging and discharging signal to a threshold voltage so as to produce a comparison signal; and a rising edge detection circuit detecting a rising edge in the comparison signal, the rising edge detection circuit producing the second or third edge detection signal based on rising edges in the comparison signal.

17. The device according to claim 16, wherein the charging and discharging circuit includes transistors connected in series between a constant power source and ground, the transistors being controlled according to the encoded data signal.

18. The device according to claim 17, wherein the comparator includes a plurality of inverters connected in series, conduction thresholds of the inverters being selected so as to correspond to the threshold voltage.

19. The device according to claim 16, wherein the comparator includes a plurality of inverters connected in series, conduction thresholds of the inverters being selected so as to correspond to the threshold voltage.

* * * * *